(12) United States Patent
Uzoh

(10) Patent No.: US 10,163,675 B2
(45) Date of Patent: Dec. 25, 2018

(54) METHOD AND APPARATUS FOR STACKING DEVICES IN AN INTEGRATED CIRCUIT ASSEMBLY

(71) Applicant: Invensas Corporation, San Jose, CA (US)

(72) Inventor: Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/629,460

(22) Filed: Jun. 21, 2017

(65) Prior Publication Data
US 2018/0130691 A1    May 10, 2018

Related U.S. Application Data

(60) Provisional application No. 62/354,283, filed on Jun. 24, 2016.

(51) Int. Cl.
*H01L 21/00* (2006.01)
*H01L 21/683* (2006.01)
(Continued)

(52) U.S. Cl.
CPC .... *H01L 21/6835* (2013.01); *H01L 21/67092* (2013.01); *H01L 21/67144* (2013.01);
(Continued)

(58) Field of Classification Search
CPC ..... H01L 21/6835; H01L 25/50; H01L 24/95; H01L 21/67092; H01L 21/67144;
(Continued)

(56) References Cited

U.S. PATENT DOCUMENTS 6,078,845 A    6/2000  Friedman
6,488,154 B1   12/2002 Yeh
(Continued)

FOREIGN PATENT DOCUMENTS

JP    07-176511 A    7/1995
JP    2007-067078 A  3/2007
(Continued)

OTHER PUBLICATIONS

International Search Report and Written Opinion for PCT Application No. PCT/US2017/038808, dated Sep. 29, 2017, 18 pages.

*Primary Examiner* — Vu A Vu

(57) ABSTRACT

Methods and apparatuses for stacking devices in an integrated circuit assembly are provided. A tray for supporting multiple dies of a semiconductor material enables both topside processing and bottom side processing of the dies. The dies can be picked and placed for bonding on a substrate or on die stacks without flipping the dies, thereby avoiding particulate debris from the diced edges of the dies from interfering and contaminating the bonding process. In an implementation, a liftoff apparatus directs a pneumatic flow of gas to lift the dies from the tray for bonding to a substrate, and to previously bonded dies, without flipping the dies. An example system allows processing of both top and bottom surfaces of the dies in a single cycle in preparation for bonding, and then pneumatically lifts the dies up to a target substrate so that topsides of the dies bond to bottom sides of dies of the previous batch, in an efficient and flip-free assembly of die stacks.

13 Claims, 8 Drawing Sheets

(51) Int. Cl.
*H01L 25/00* (2006.01)
*H01L 21/67* (2006.01)
*H01L 25/065* (2006.01)
*H01L 23/00* (2006.01)

(52) U.S. Cl.
CPC .............. *H01L 24/95* (2013.01); *H01L 25/50* (2013.01); *H01L 24/75* (2013.01); *H01L 25/0657* (2013.01); *H01L 2221/68313* (2013.01); *H01L 2221/68354* (2013.01); *H01L 2221/68363* (2013.01); *H01L 2224/7501* (2013.01); *H01L 2224/753* (2013.01); *H01L 2224/7598* (2013.01); *H01L 2225/06513* (2013.01); *H01L 2225/06517* (2013.01)

(58) Field of Classification Search
CPC ....... H01L 2224/7598; H01L 2224/753; H01L 2224/7501; H01L 24/75; H01L 2221/68363; H01L 2221/68313; H01L 2221/68354
USPC ........................................................ 438/109
See application file for complete search history.

(56) References Cited

U.S. PATENT DOCUMENTS

| | | | |
|---|---|---|---|
| 6,631,807 | B2 | 10/2003 | Nemoto et al. |
| 7,956,447 | B2 | 6/2011 | Enquist et al. |
| 2009/0176333 | A1 | 7/2009 | Matsubara et al. |
| 2010/0226020 | A1* | 9/2010 | Asami ...................... G02B 9/12 359/716 |
| 2013/0220383 | A1* | 8/2013 | Fujikata ............ H01L 21/67051 134/36 |
| 2015/0243591 | A1* | 8/2015 | von Koblinski ........ H01L 21/52 257/666 |

FOREIGN PATENT DOCUMENTS

| | | |
|---|---|---|
| JP | 2011-192663 A | 9/2011 |
| KR | 10-2006-0023661 A | 3/2006 |

\* cited by examiner

METHOD AND APPARATUS FOR STACKING DEVICES IN AN INTEGRATED CIRCUIT ASSEMBLY

This patent application claims the benefit of priority to U.S. Provisional Patent No. 62/354,283 to Uzoh, filed Jun. 24, 2016, which is incorporated by reference herein in its entirety.

BACKGROUND

Conventional die trays for handling semiconductor materials for chip assemblies can introduce significant drawbacks into processing steps. As shown in FIG. 1, dies 102 are conventionally flipped from one die tray 100 to another die tray 110 after processing a topside 106 of each die 102, in order to expose the bottom sides of the dies 102 for bottom side processing. In a conventional process, individual dies 102 are placed into cavities of a conventional die tray 100. Selective removal of a protective layer 104 is followed by a cleaning process. The dies 102 may then undergo a surface activation and termination steps 108. The dies 102 are transferred from the first die tray 100 to a second die tray 110 by flipping the dies 102. The transferred dies 102 are thus face down (exposed topside 106 down) on the second die tray 110. The dies 102 may then be picked up from the second die tray 110 by surfaces of each die 102 protected by a resist layer 112, and attached to a surface of a wafer or substrate 114 for low temperature bonding operations, for example. The protective resist layer 112 may then be removed. But the singulated dies 102 being processed have coarse surfaces on the lateral sides where dicing has taken place to singulate the dies. The coarse surfaces of the dies 102 easily produce particulate debris during the flip from tray 100 to tray 110. The dies 102 may also nick, crack, and chip because of the flipping operation, further producing crumbs and particles of the semiconductor material during the flipping operation. The loose particles prevent intimate mating between the dies 102 and the mating and bonding surfaces beneath.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

This disclosure describes example methods and apparatuses for stacking devices in an integrated circuit assembly. Example systems and techniques allow dies of semiconductor material to undergo both topside and bottom side processing, such as cleaning operations, while situated in a die tray, but without flipping the dies. The dies can then be transferred for bonding to a substrate or to other dies, by various techniques that do not flip the dies, providing several advantages. Conventional flipping operations generate loose particulate debris that contaminates the integrity of subsequent bonding steps and cripples the yield. Conventional flipping operations also become a greater liability as die thicknesses decrease. The example systems described herein can provide low-cost and high-yield die-to-die stacking processes that avoid flipping the dies. Moreover, example systems can handle very thin dies, since the dies do not have to be flipped.

The example systems and methods are applicable to manufacture of DRAM stacks, for example. Such DRAM memory stacks may employ DBI® (direct bond interconnect) and ZIBOND® (low-temperature homogeneous bonding) techniques (Ziptronix Inc., Raleigh, N.C.; Invensas Corporation, and Tessera Technologies Inc., San Jose, Calif.). But the example systems and methods herein are not limited to manufacture of DRAM stacks, and are not limited to particular back-end-of-line (BEOL) processes or particular bonding or interconnect techniques, such as DBI®. The example systems and methods for stacking devices in an integrated circuit assembly can be applied to numerous manufacturing processes.

Example Systems and Methods

Figure 1:
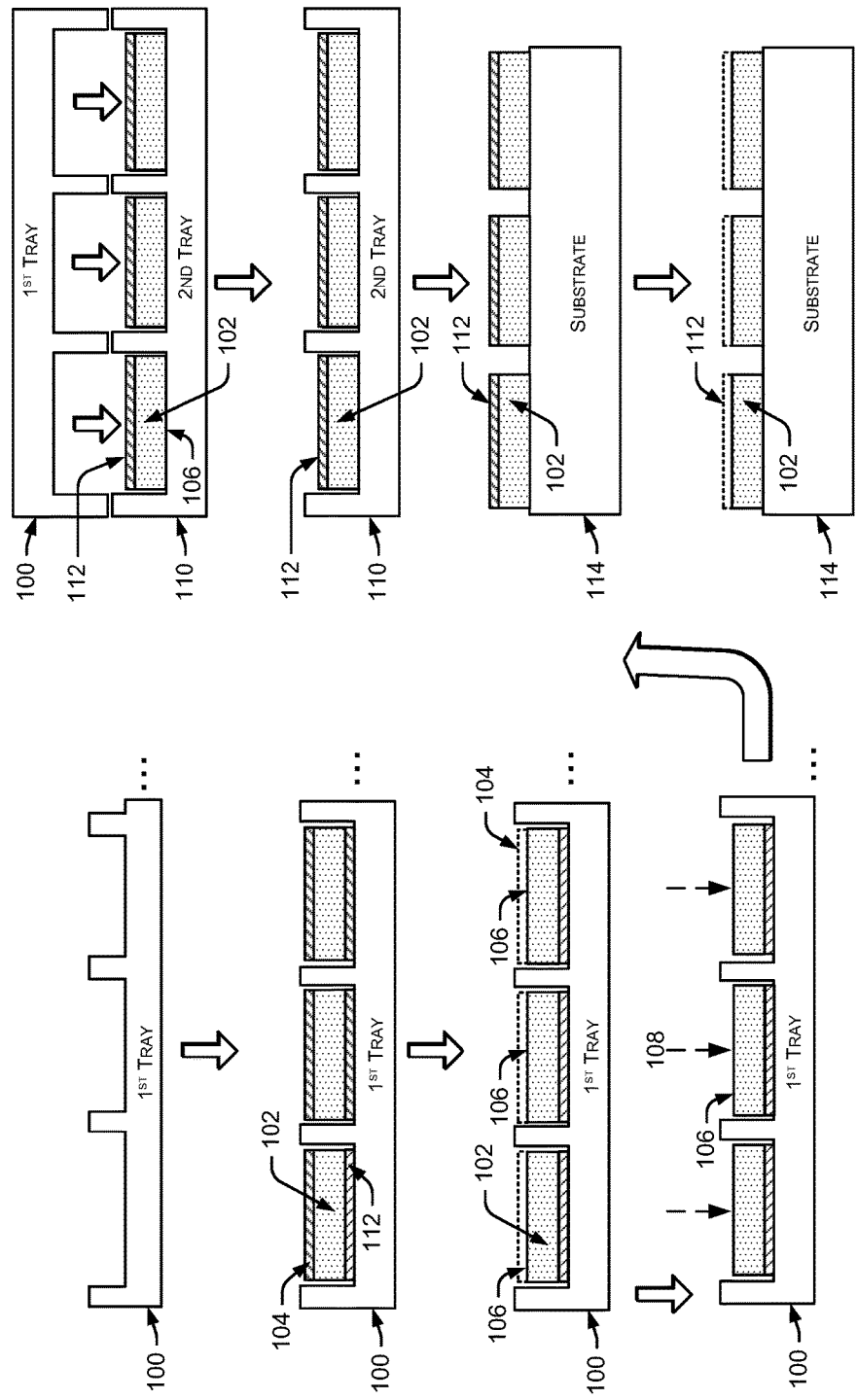
FIG. 1 is a diagram of a prior art process for stacking dies.
Figure 2:
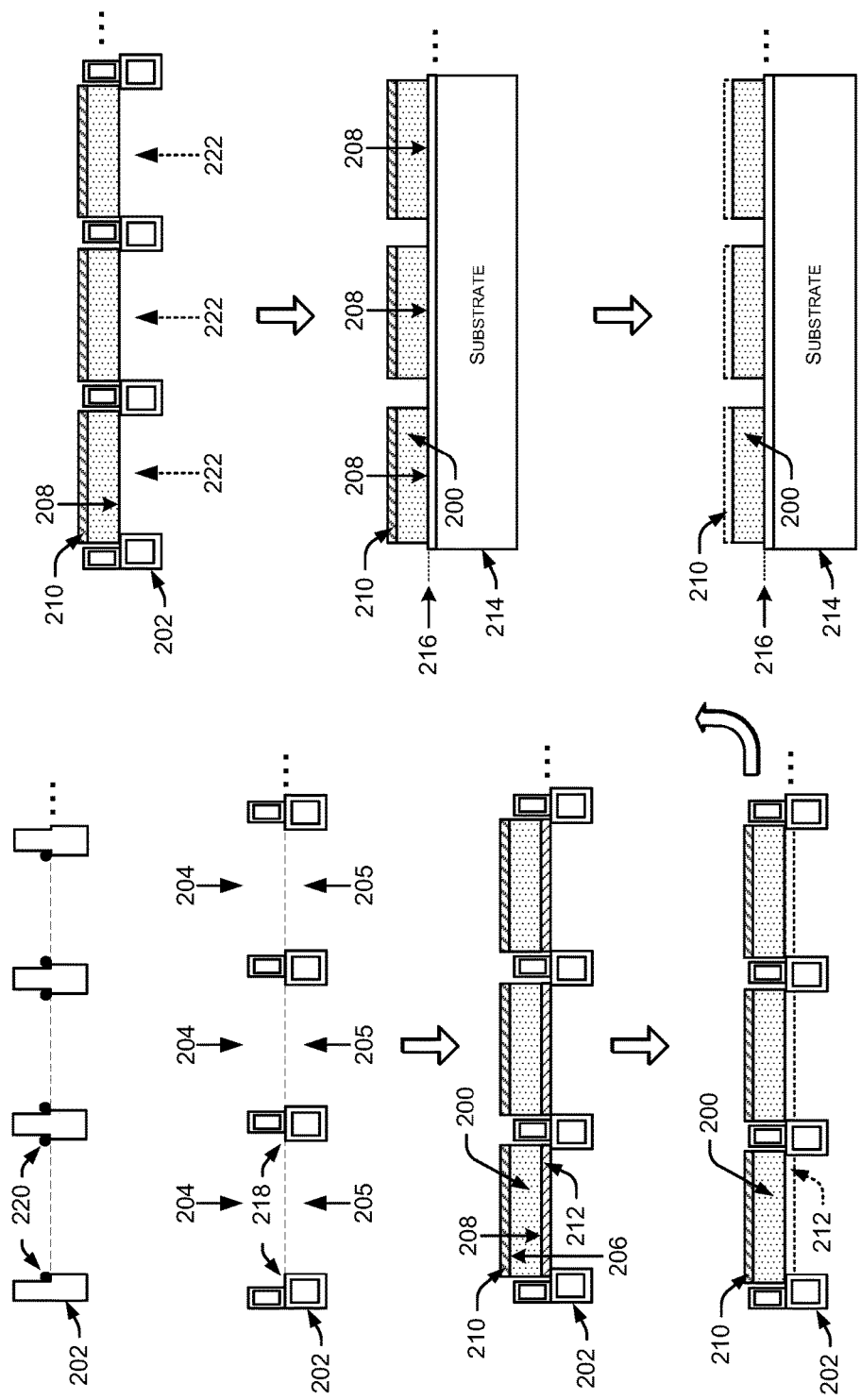
FIG. 2 is a diagram of an example system and process for stacking devices to make a 3D integrated circuit assembly.

FIG. 2 shows a first example system and process for stacking devices to make a 3D integrated circuit assembly. In an implementation, dies 200 are placed in a die tray 202 that has through-holes 204/205 allowing processing on both a topside 206 and a bottom side 208 of each die 200. Example dies 200 may be 10×10 mm dies, or 10×12 mm dies, or much smaller. Thicknesses of the dies 200 may be 10-50 microns, or much thinner or thicker. Each die 200 may have a top protective coating 210 on the topside 206 and a lower protective coating 212 on the bottom side 208 of the die 200. In some embodiments, there is only one protective coating layer on the die and the protective coating 206 is either the top or bottom side of the die. The bottom sides 208 of the dies 200 may be prepared for bonding to a substrate 214 through the lower through-holes 205, by selectively removing the lower protective coating 212 from the bottom surface 208 of the die. In other embodiments both protective coating 206 and 212 may be removed during the cleaning operation in tray 202.

The dies 200 may then be picked from the die tray 202, and without flipping the dies 200, the now-exposed bottom sides 208 of the dies 200 can be placed on a wafer or substrate 214 for a subsequent bonding step 216. Since the bottom faces 208 of the dies 200 to be processed for bonding 216 to the substrate 214 remain bottom side down in the die tray 202, and are processed on the underside 208 via the through-hole 205, the dies 200 are not flipped bottom side up during this first example process.

The bonding between dies 200 and substrate 214, or between dies 200 and a successive layer of dies 200 in a stack being assembled, can be by low temperature oxide bonding (ZIBOND), or DBI® bonding, for example, resulting in a bonding layer 216 or bonding-interconnect layer. After bonding 216, an upper protective coating 210 and/or other unwanted materials or contaminants present on the back surface of the bonded die may be removed from the dies 200 by cleaning the substrate and the bonded dies.

The example die tray 202 can be various different structures for supporting for example, a semiconductor material, a dielectric material (including glass), conductive material or any desirable die, a device or even substrates for both topside 206 processing and bottom side 208 processing. The example die tray 202 may utilize a bezel 218. As used herein, a bezel 218 is a rim, flange, ledge, lip, curves, spherical cap or dome, tabs or other structure, members, or geometry (for example, 5 mm or much less) associated with the example die tray 202 for supporting a die 200, while allowing underside access to the bottom side 208 of the die 200 being supported in the die tray 202. For example, the bezel 218 may be disposed on an interior perimeter of the die tray 202 for supporting the semiconductor material at an edge of the semiconductor material. It is noted that the tray 202 may alternatively be configured to accommodate planar or non-planar workpieces larger than a typical die including, but not limited to, panels, wafers, reconstituted workpieces, or the like.

A through-hole 205 in the die tray 202 for enabling access to a bottom side 208 of the semiconductor material of the die 200 for at least the bottom side processing, does not preclude processing of the topside 206 of the die 200, including simultaneous processing of both the topside 206 and the bottom side 208 of the die 200.

The through-hole 205 may enable access to an entire bottom side 208 of the semiconductor material of the die 200 for the bottom side 208 processing, except for one or more areas of contact between the bezel 218 and the edge of the semiconductor material of the die 200. The bezel 218 may also have ridges, bumps, spheres 220, hemispheres, microspheres, nanowires, or pins built-in or on top of the bezel 218 to reduce the one or more areas of contact between the bezel 218 and the edge of the semiconductor material of the die 200, for increasing the access to the entire bottom side 208 of the semiconductor material.

In an implementation, a layer, such as compliant hydrophobic layer or coating may be applied to the die tray 202 to shed standing water and water films, and to avoid surface adhesion of water molecules to the die tray 202 during processing operations, such as cleaning operations on the dies 200. The hydrophobic layer may also be selected to provide a scratch-resistant surface on the die tray 202 during such operations, which may further include cleaning operations, coating removal processes, layer removal processes, activation processes, such as plasma activation of a surface, termination processes 222 with water or ammonia, laminating processes, various bonding processes, and the aforementioned direct bond interconnect (DBI) processes, for example. The tray material 202 may comprise of or be fabricated with, for example, oxygen and/or plasma resistant material. In one implementation the tray material 202 may comprise of alumina or yttrium oxide (yttria). In other implementations, the tray 202 may be fabricated with, for example, aluminum and the surface of the tray may be coated with aluminum oxide or an yttria layer or a combination of both materials by atomic layer coating methods or plasma spray coating or other suitable techniques.

Figure 3:
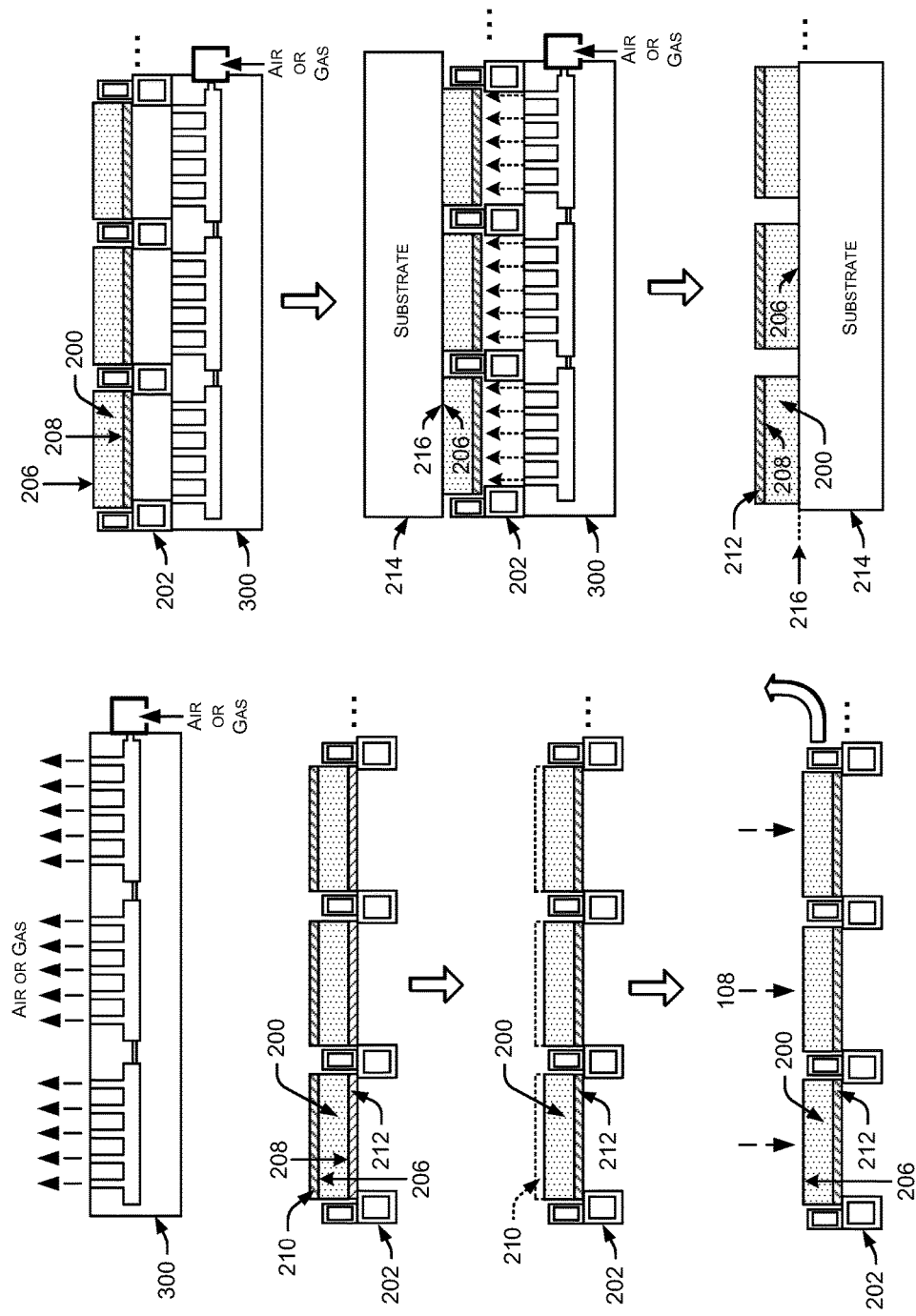
FIG. 3 is a diagram of another example system and process for stacking devices to make a 3D integrated circuit assembly including using pneumatic lift.
Figure 4:
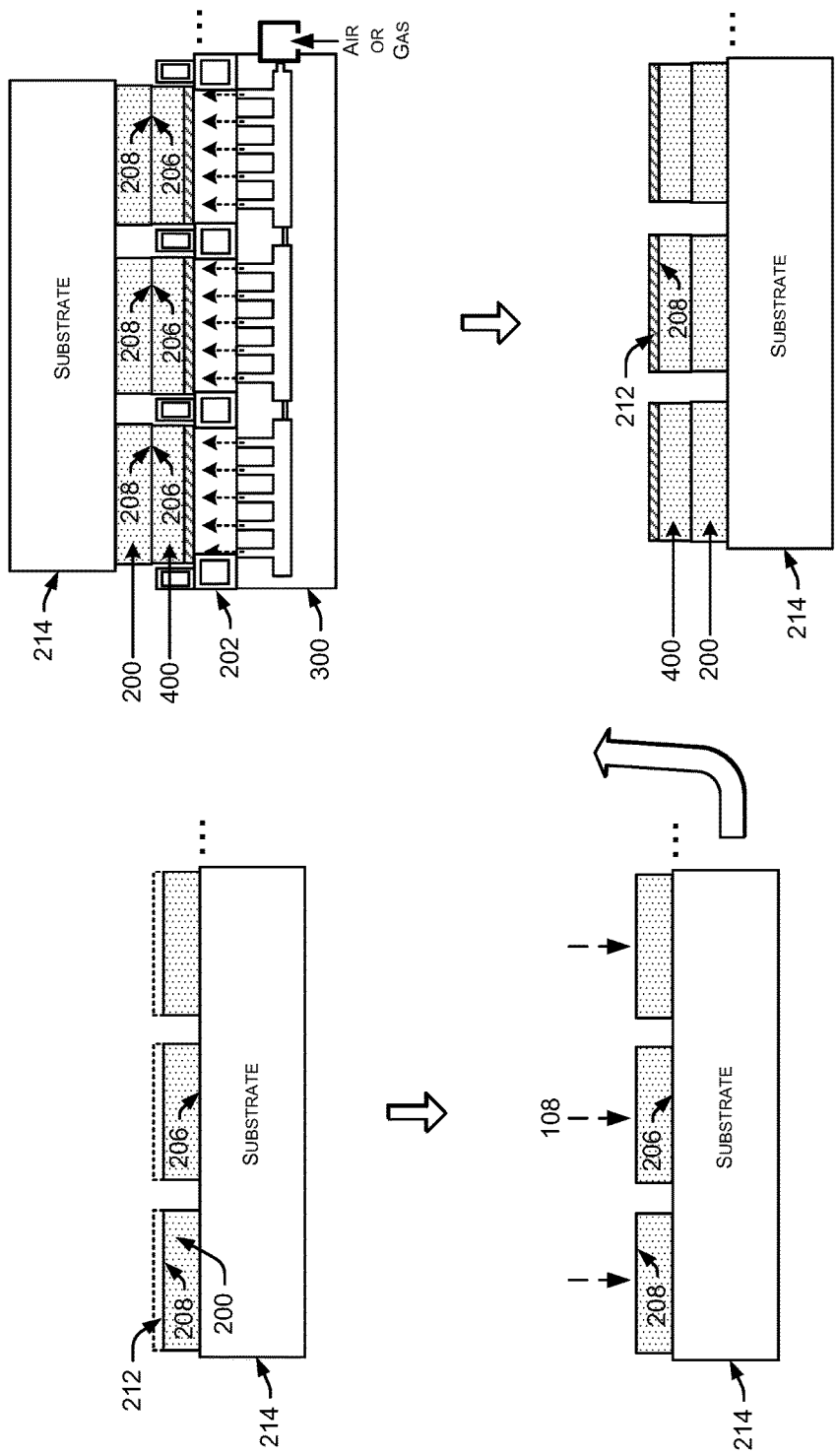
FIG. 4 is a diagram of an example continuation of the process for stacking devices to make a 3D integrated circuit assembly shown in FIG. 3.

FIGS. 3-4 present example methods of stacking dies 200, in a manner that leaves a protective layer or coating 212 on each successive layer of dies 200 in the stack, while removing a protective layer 210 over surfaces to be bonded.

FIG. 3 shows an example method and apparatus that can be used for stacking devices to make a 3D integrated circuit assembly, including a liftoff apparatus 300 for buoying up dies 200 from a die tray 202 on a layer or burst of a gas, such as filtered air, nitrogen, an inert gas, or a gas used chemically in an assembly step. In an implementation, the liftoff apparatus 300 is a member for directing a pneumatic flow of the gas, for example at 3-5 psi, to the bottom side of the dies 200 for lifting the dies 200 from the die tray 202 directly to a substrate 214, wafer, or other stacked die for bonding 216. The liftoff assembly 300 may be attachable to, and detachable from, the die tray 202. The target substrate 214, wafer, or other stacked die 200 may be held upside-down, so that the prepared top surface 206 of the die 200 bonds to the target surface of the substrate 214 presented above the die 200. The pneumatic flow pushes the dies 200 from the support of the die tray 202 to the target surface of the substrate 214 so that the bonding surfaces 216 contact each other and mate. The distance that the dies 200 are lifted depends on implementation, but may be as little as 40 microns, or even less. The dies 200 being lifted by the pneumatic flow and the target surface on the substrate 214 or die stack may be aligned by camera and fiducials for bonding alignment, with some tolerance for variation built into the width of interconnect lines, for example.

A corresponding process places the dies 200 in an example die tray 202 that has through-holes 204/205 for allowing processing on the topside 206 and on the underside 208 of the dies 200, thereby enabling both topside 206 and bottom side 208 processing of each die 200, without the dies 200 leaving the die tray 202. In one scenario, as shown in FIG. 3, the topsides 206 of the dies 200 are prepared for bonding to a substrate 214, while the dies 200 are in the die tray 202, by selectively removing the upper protective coating 210. When the topsides 206 are prepared 108, including for example, being cleaned, activated, and/or terminated, then the liftoff apparatus 300 positioned below the die tray 202 provides the pneumatic flow to the bottom surface 208 of the dies 200 that lifts the dies 200 from the die tray 202 without flipping the dies 200, to bond the top surfaces of the dies 200 to the substrate 214, which can be positioned above the die tray 202.

FIG. 4 shows an example continuation of the process for stacking devices to make a 3D integrated circuit assembly shown in FIG. 3. In FIG. 4, the process of FIG. 3 or FIG. 2 is repeated multiple times by removing a protective layer 212 or 210 on the first batch of dies 200 placed on the substrate 214, as in FIG. 3 or FIG. 2. The newly exposed surface 208 of the dies 200 is then processed, for example by being activated and terminated for bonding. The liftoff apparatus 300, meanwhile, can be loaded with a subsequent set of dies 400, which have their top surfaces 206 processed as in FIG. 3. This next batch of dies 400 is then lifted by a pneumatic flow from the liftoff apparatus 300 to bond with the upside-down "top surfaces" of the first batch of dies 200, formerly the original bottom surfaces 208 of the dies 200 positioned above the die tray 202. This process may be repeated multiple times to build die-to-die stack assemblies, without having to flip the dies 200 & 400 & . . . , from the die tray 202.

Figure 5:
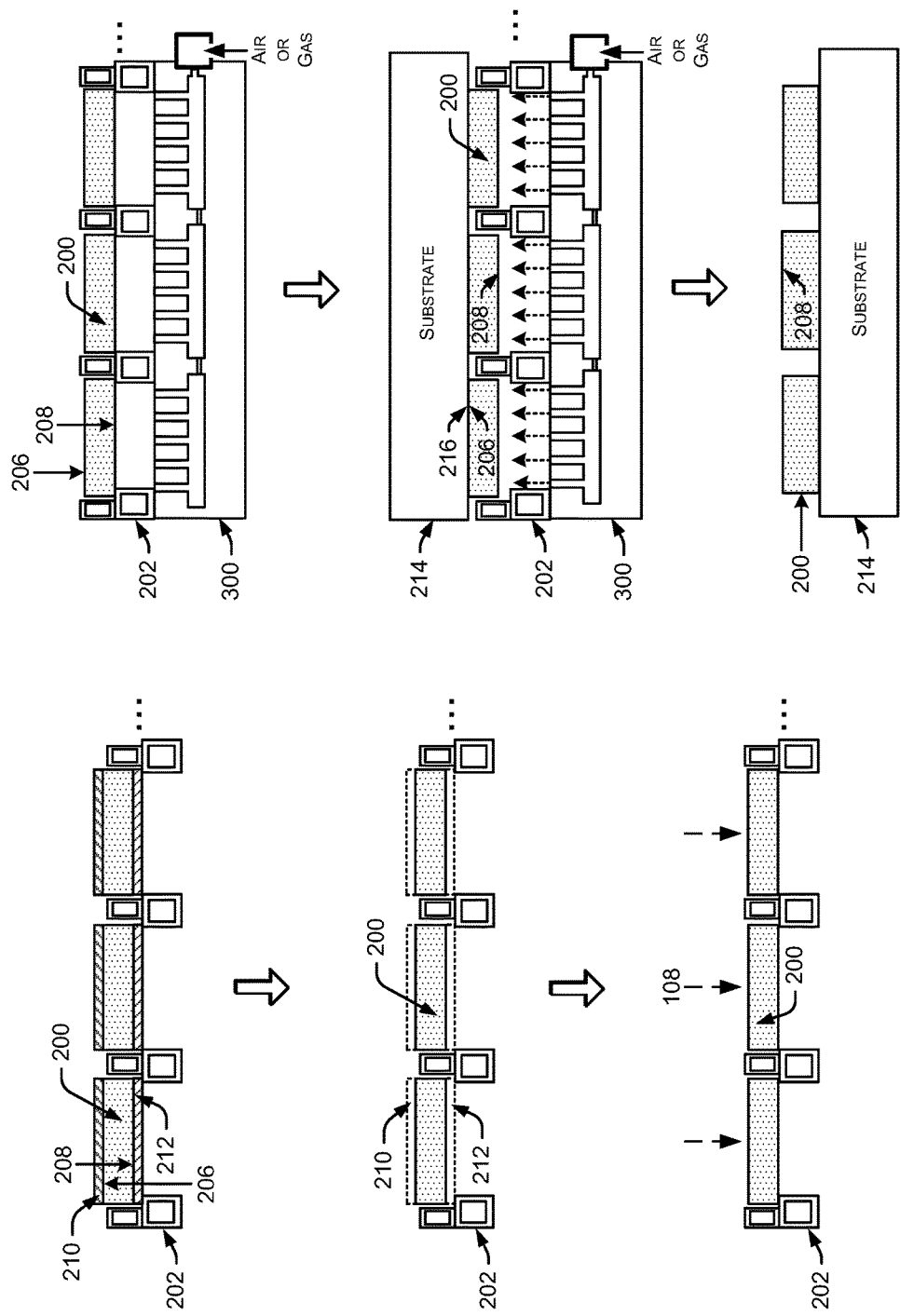
FIG. 5 is a diagram of another example process for stacking devices to make a 3D integrated circuit assembly including using pneumatic lift.

FIG. 5 shows another example process for stacking devices to make a 3D integrated circuit assembly. In distinction from the example processes of FIGS. 3-4, the example method of FIG. 5 removes both top and bottom protective layers 210 & 212 at once, leaving most recently exposed die surfaces 206 & 208 immediately available for further stacking and bonding with successive layers of dies 200.

In an implementation, the dies 200 are placed in a die tray 202 that has through-holes 204/205 allowing processing from the underside on the bottom sides 208 of the dies 200, not precluding processing on the top surfaces 206 of the dies 200. Both the top surfaces 206 of the dies 200 and the bottom surfaces 208 of the dies 200 are prepared for bonding 216 to a substrate 214 or to the exposed surfaces of a next batch of the dies 200. For example, the dies 200 may have a layer of polar or nonpolar resist on both top 206 and bottom 208 surfaces, to be removed. The batch of dies 200 is pneumatically lifted from the die tray 202 and without flipping the individual dies 200, the dies 200 are bonded 216 to the substrate 214. The opposing, bottom surfaces 208 of the dies 200 are now exposed for bonding 216 to a next batch of the dies 200. The next batch of dies 200 are loaded into the die tray 202, and this next batch of the dies 200 also has the top surfaces 206 and bottom surfaces 208 of the dies 200 already prepared for bonding 216 in one preparation cycle, that is, without the dies 200 leaving the die tray 202. The top surfaces 206 of the next batch of the dies 200 are bonded to the exposed surfaces 208 of the dies 200 previously bonded 216 to the substrate. This process may be repeated multiple times to bond topsides 206 of each next batch of the dies 200 to the bottom sides 208 of each previous batch of the dies 200 bonded to the substrate 214, to assemble die-to-die stacks. In each repetitive single cycle of the stacking operation, including preparation steps, and through the entire process, the dies 200 being stacked are never flipped during stack assembly.

In an implementation, a process may simultaneously remove upper and lower die protective coatings 210 & 212 from the respective topsides 206 and bottom sides 208 of the dies 200. The dies 200 may be ultrathin, since there is no flipping operation to damage the dies 200 or to create detrimental dust and particles. The thin dies 200 may be 50 microns or less in thickness, for example 10 microns, or even less.

An example technique also etches the lateral sides of the dies 200 to decrease the possibility of particulate debris separating from the dies 200 during placement or lifting, and to prevent the particulate debris from chipping, cracking, flaking, and falling onto the die tray 202 to compromise the integrity of the process.

Example Methods

Figure 6:
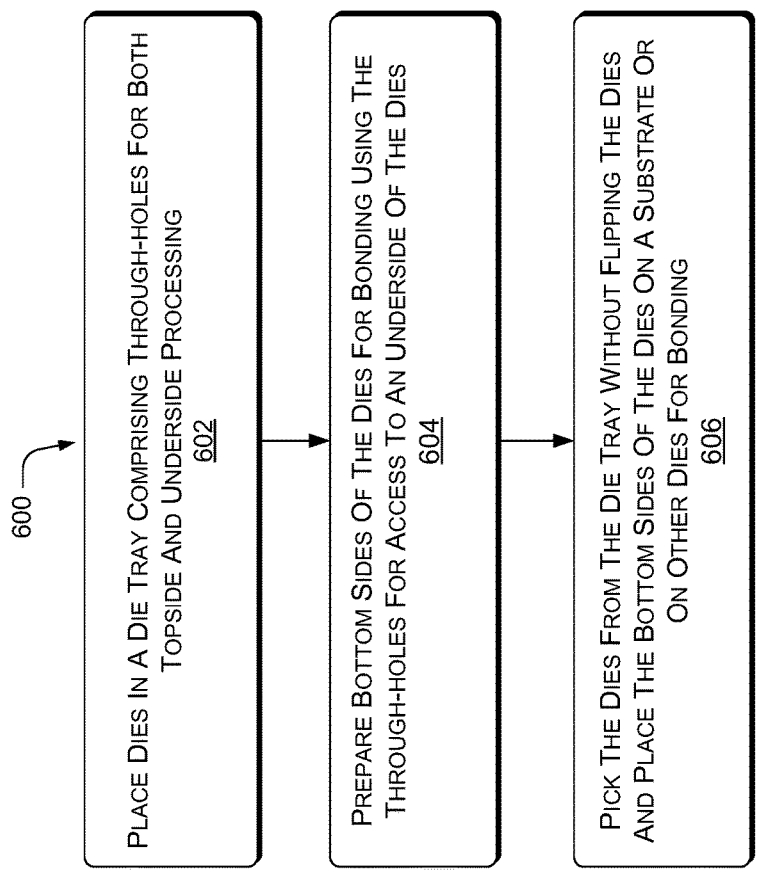
FIG. 6 is a flow diagram of an example method of stacking devices to make an integrated circuit assembly.

FIG. 6 shows an example method 600 of stacking devices to make an integrated circuit assembly. In the flow diagram of FIG. 6, operations of the example method 600 are shown in individual blocks.

At block 602, dies are placed in a die tray comprising through-holes allowing processing on both a topside and a bottom side of each die.

At block 604, the bottom sides of the dies are prepared for bonding to a substrate or to other dies. The preparation may include removing a lower protective coating, such as a polar or nonpolar resist layer, from the bottoms of the dies. The preparation may further include surface activation for bonding, and a termination operation.

At block 606, the dies are picked from the die tray and without flipping, the bottom sides of the dies are bonded with the substrate or with other dies.

An upper protective coating, such as a polar or nonpolar resist layer, may be removed from the tops of the dies just bonded to the substrate to continue the stacking cycle. When repeated, the process includes bonding the bottoms of the next batch of dies, as above, to the tops of the dies already bonded to the substrate, after removing the protective coating from the tops of the dies already bonded to the substrate.

Figure 7:
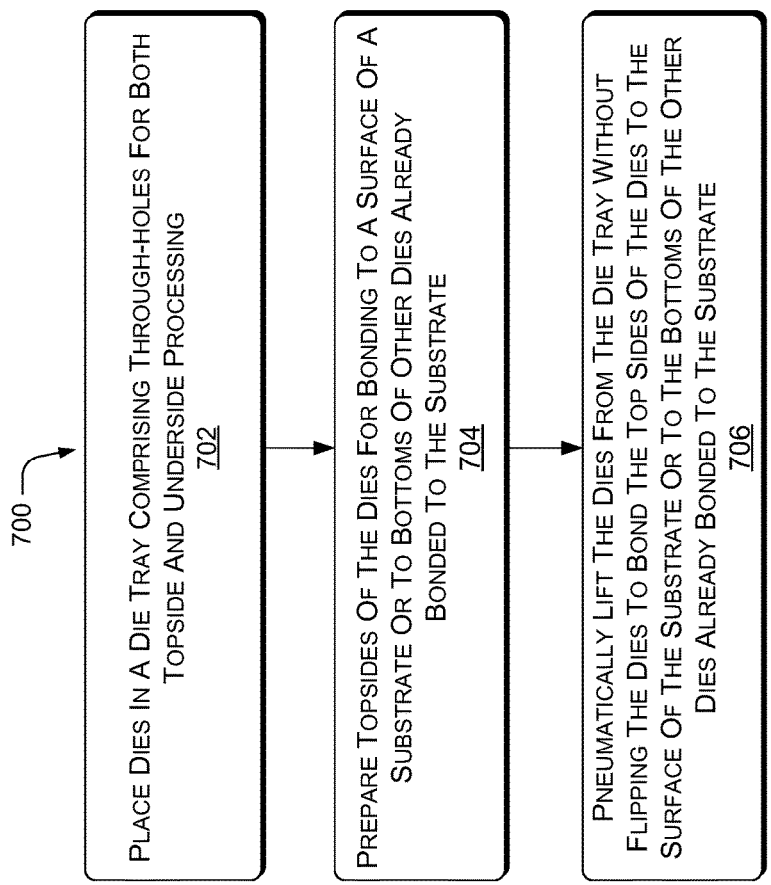
FIG. 7 is a flow diagram of another example method of stacking devices to make an integrated circuit assembly while leaving a protective layer in place on nonbonding surfaces.

FIG. 7 shows another example method 700 of stacking devices to make an integrated circuit assembly. In the flow diagram of FIG. 7, operations of the example method 700 are shown in individual blocks.

At block 702, dies are placed in a die tray comprising through-holes allowing processing on both a topside and a bottom side of each die.

At block 704, the topsides of the dies are prepared for bonding to a surface of a substrate held upside-down, or to bottoms of other dies already bonded to the substrate.

At block 706, the dies are pneumatically lifted from the die tray and without flipping the dies, the topsides of the dies are bonded to the surface of the substrate, or to the bottoms of other dies already bonded to the substrate.

Figure 8:
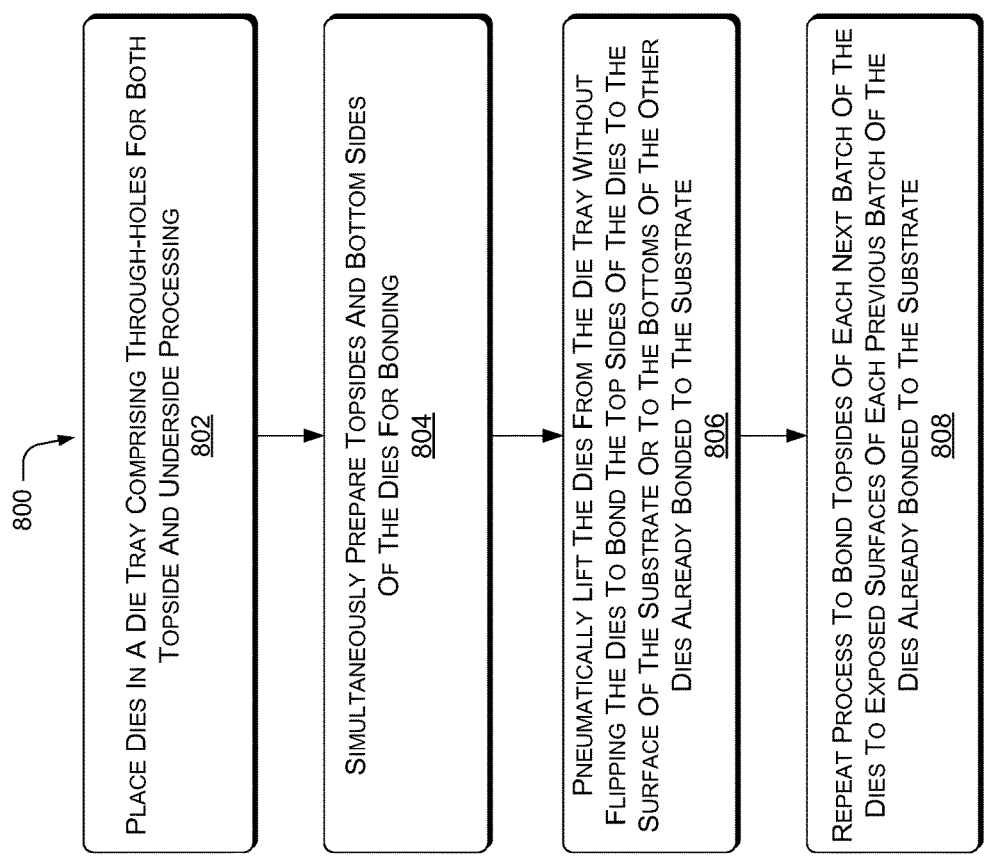
FIG. 8 is a flow diagram of another example method of stacking devices to make an integrated circuit assembly including removing protective layers from both top and bottom surfaces of a die for pneumatic lift stacking of the dies in a single assembly cycle.

FIG. 8 shows another example method 800 of stacking devices to make an integrated circuit assembly. In the flow diagram of FIG. 8, operations of the example method 800 are shown in individual blocks.

At block 802, dies are placed in a die tray comprising through-holes allowing processing on both a topside and a bottom side of each die.

At block 804, the topsides and bottom sides of the dies are both prepared for bonding to a substrate or to other dies.

At block 806, the dies are pneumatically lifted from the die tray and without flipping the dies the topsides of the dies are bonded to a surface of a substrate held upside-down, or to bottoms of other dies already bonded to the substrate.

At block 808, the method is repeated multiple times to bond topsides of each next batch of the dies to the bottom sides (or other exposed surfaces) of each previous batch of the dies, to creates stacks of the dies bonded to the substrate. The die stack is subsequently heat treated at higher temperature in an inert ambient environment or in vacuum. The heat treating temperature may range between 150 to 400° C. for 15 minutes to less than 20 hours. The lower the temperature the longer the heat treatment times.

In the specification and appended claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. An apparatus, comprising:
   a die tray for supporting a semiconductor material for both topside processing and bottom side processing;
   a bezel disposed on an interior perimeter of the die tray for supporting the semiconductor material at an edge of the semiconductor material; and a through-hole in the die tray for enabling access to at least a bottom side of the semiconductor material for at least the bottom side processing; and a liftoff member for directing a pneumatic flow of a gas to the bottom side of the semiconductor material for lifting the semiconductor material from the die tray to a substrate, a wafer, or a die.

2. The apparatus of claim 1, wherein the through-hole enables access to an entire bottom side of the semiconductor material for the bottom side processing except for one or more areas of contact between the bezel and the edge of the semiconductor material.

3. The apparatus of claim 1, further comprising bumps, spheres, hemispheres, ridges, nanowires, or pins on the bezel to reduce the one or more areas of contact between the bezel and the edge of the semiconductor material to increase the access to the bottom side of the semiconductor material.

4. The apparatus of claim 1, wherein the die tray enables simultaneous topside processing and bottom side processing of the semiconductor material.

5. The apparatus of claim 1, further comprising a hydrophobic layer or coating on the die tray.

6. The apparatus of claim 5, wherein the hydrophobic layer comprises a scratch resistant surface.

7. The apparatus of claim 1, wherein the through-hole enables access to the bottom side for a process selected from the group consisting of a cleaning operation, a coating removal process, a layer removal process, an activation process, a termination process, a laminating process, a bonding process, and a direct bond interconnect process.

8. The apparatus of claim 1, wherein the die tray enables the semiconductor material to be picked up from the die tray and enables the bottom side of the semiconductor material to be attached to a substrate without flipping the semiconductor material.

9. A system, comprising:

a frame for holding a die of a semiconductor material while exposing a top and a bottom of the die for processing;

an interior rim of the frame for supporting the die at an edge of the die;

a tray composed of an array of the frames for processing multiple dies;

a liftoff apparatus attachable or mateable to a base of the tray; and wherein the liftoff apparatus provides a pneumatic gas flow to push the multiple dies from the tray into contact with a wafer or a substrate, or onto respective dies of multiple die stacks, for bonding.

10. The system of claim 9, wherein the interior rim comprises surface features to reduce a contact area between the interior rim and the edge of the die in order to increase an area of the bottom of the die available for the processing.

11. The system of claim 9, wherein the tray composed of the array of the frames enables simultaneous removal of upper and lower die protective coatings, activation of top surfaces of the multiple dies, termination processing of the top surfaces of the multiple dies, and bonding of the multiple dies to a wafer, a substrate, or to respective multiple die stacks, without flipping the multiple dies.

12. The system of claim 11, wherein the tray and the liftoff apparatus position the multiple dies to bond top surfaces of the multiple dies with the wafer, the substrate, or the respective multiple die stacks, while the bottom surfaces of the multiple dies are ready for bonding to a next placement of top surfaces of a next batch of multiple dies to be processed by the system, in an ongoing assembly of the multiple die stacks.

13. A system, comprising:

a frame for holding a die of a semiconductor material while exposing a top and a bottom of the die for processing;

an interior rim of the frame for supporting the die at an edge of the die;

a tray composed of an array of the frames for processing multiple dies; and wherein the tray composed of the array of the frames enables simultaneous removal of upper and lower die protective coatings, activation of top surfaces of the multiple dies, termination processing of the top surfaces of the multiple dies, and bonding of the multiple dies to a wafer, a substrate, or to respective multiple die stacks, without flipping the multiple dies.

* * * * *